US011375634B1

(12) United States Patent
Lund et al.

(10) Patent No.: US 11,375,634 B1
(45) Date of Patent: Jun. 28, 2022

(54) CIRCUIT CARD ASSEMBLY STANDOFF CLIP

(71) Applicant: LOCKHEED MARTIN CORPORATION, Bethesda, MD (US)

(72) Inventors: Peter Derek Lund, Littleton, CO (US); Richard Allen Lawson, Littleton, CO (US); Jason Eric Sieber, Littleton, CO (US)

(73) Assignee: Lockheed Martin Corporation, Bethesda, MD (US)

( * ) Notice: Subject to any disclaimer, the term of this patent is extended or adjusted under 35 U.S.C. 154(b) by 78 days.

(21) Appl. No.: 16/418,919

(22) Filed: May 21, 2019

(51) Int. Cl.
*F16B 2/22* (2006.01)
*F16B 2/18* (2006.01)
*B43K 23/00* (2006.01)
*F16M 13/00* (2006.01)
*B25B 1/00* (2006.01)
*H05K 7/14* (2006.01)
*B65D 85/68* (2006.01)
*B65D 81/05* (2006.01)
*F16B 2/02* (2006.01)

(52) U.S. Cl.
CPC .......... *H05K 7/1404* (2013.01); *B65D 81/05* (2013.01); *B65D 85/68* (2013.01); *F16B 2/22* (2013.01); *B65D 2585/86* (2013.01); *F16B 2/02* (2013.01); *F16B 2/185* (2013.01); *H05K 7/1427* (2013.01)

(58) Field of Classification Search
CPC .... B65D 81/05; B65D 85/68; B65D 2585/86; F16B 2/22; H05K 7/14237

USPC ........... 248/316.7, 74.2, 72, 229.16, 229.26, 248/231.81
See application file for complete search history.

(56) References Cited

U.S. PATENT DOCUMENTS

| | | | | |
|---|---|---|---|---|
| 2,815,777 A * | 12/1957 | Iraids | ...................... | B25B 5/142 81/424 |
| 3,659,331 A * | 5/1972 | Drake | ................. | A47G 27/0493 29/268 |
| 4,277,864 A * | 7/1981 | Orson, Sr. | ............... | A44B 99/00 24/327 |
| 5,023,989 A * | 6/1991 | Hargrave | ................ | B05B 15/00 29/426.5 |
| 5,414,911 A * | 5/1995 | Adams | .................... | A44B 99/00 24/507 |
| 5,489,075 A * | 2/1996 | Ible | ........................ | A61J 9/0692 24/298 |
| 7,950,122 B2 * | 5/2011 | Saylor | .................... | A63D 15/10 29/268 |

(Continued)

*Primary Examiner* — Tan Le
(74) *Attorney, Agent, or Firm* — BakerHostetler

(57) ABSTRACT

A standing clip for supporting an object in an upright position includes a flexible grip having an upper lever arm, a lower lever arm, and first and second support legs. The first support leg extends from the upper lever arm at a second end of the flexible grip, and the second support leg extends from the lower lever arm at the second end of the flexible grip. The first and second support legs include complimentary clamping surfaces configured for clamping the object therebetween, and are spaced apart from each other by a gap. The flexible grip is depressible from a first state in which the gap is a first size to a second state in which the gap is a second size. The first and second support legs are oriented substantially vertically in the second state to clamp and suspend the object above a desired surface.

9 Claims, 6 Drawing Sheets

(56) References Cited

U.S. PATENT DOCUMENTS

| | | | |
|---|---|---|---|
| 8,251,329 B2* | 8/2012 | Suciu | G09F 15/0018 248/316.2 |
| 2017/0043610 A1* | 2/2017 | Buttner | F16B 2/22 |

\* cited by examiner

CIRCUIT CARD ASSEMBLY STANDOFF CLIP

TECHNICAL FIELD

The present disclosure relates generally to fixtures for upright mounting of circuit boards. More specifically, the present disclosure relates to a standing clip for a circuit board.

BACKGROUND

Circuit boards for space vehicles are generally manufactured in extremely high variety and low volume when compared to other electronics manufacturing sectors. For example, in some instances in a period of two years, a manufacturer may build approximately 1400 circuit boards consisting of approximately 156 different assembly types of circuit boards. The circuit boards are generally extremely high value and costly to make, and so it is important that every effort be taken to minimize risk of damage to the circuit boards as they move through various assembly processes (e.g., automated processes, hand assembly, oven cycles, storage, and other similar processes).

Currently available standoff (standing) fixtures for circuit boards are designed to be circuit board specific, and therefore are configured to specifically mount single assembly types of circuit boards. However, configuring the standoff fixtures specifically for one type of circuit board will necessitate manufacturing and/or acquiring a variety of standoff fixtures equally large in number to match the different types of circuit boards, thereby driving the cost up.

Other currently available standoff fixtures include generic threaded standoff fixtures, which in addition to being incapable of accommodating a variety of sizes of circuit board, also require holes to be made in the circuit board for insertion of the threaded fixtures.

The description provided in the background section should not be assumed to be prior art merely because it is mentioned in or associated with the background section. The background section may include information that describes one or more aspects of the subject technology.

SUMMARY

Accordingly, there is a need in the field for a cost-effective, simple to use, and universally applicable standing fixture for securing and upright mounting of a variety of sizes and types of circuit boards during assembly, packaging, processing and other activities in which the circuit board may need to be suspended above a desired surface.

In accordance with various embodiments of the present disclosure, a standing clip for supporting an object in an upright position may include a flexible grip having an upper lever arm and a lower lever arm coupled to each other, a first support leg, and a second support leg. Each of the upper and lower lever arms may extend from a first end to a second end of the flexible grip. The first support leg may extend from the upper lever arm at the second end of the flexible grip, and the second support leg may extend from the lower lever arm at the second end of the flexible grip. The first and second support legs may have complimentary clamping surfaces configured for clamping the object therebetween. The second support leg may be positioned opposite to and spaced apart from the first support leg by a gap. The flexible grip may be depressible from a first state in which the gap is a first size to a second state in which the gap is a second size. The first and second support legs may be oriented substantially vertically in the second state to clamp and suspend the object above a desired surface.

In accordance with some embodiments, a standing clip for suspending an object above a surface may include a flexible grip having an upper lever arm and a lower lever arm. Each of the upper and lower lever arms may extend from a first end to a second end of the flexible grip. The standing clip may further include a first support leg rotatably coupled to the upper lever arm at the second end of the flexible grip, and a second support leg spaced apart from the first support leg and rotatably coupled to the lower lever arm at the second end of the flexible grip. The flexible grip may be manipulable to vary a size of a gap between the spaced apart first and second support legs to support the object therebetween. The first and second support legs may be rotatable relative to the respective upper and lower lever arms to orient the first and second support legs perpendicularly relative to the object supported therebetween.

It is to be understood that both the foregoing general description and the following detailed description are exemplary and explanatory and are intended to provide further explanation of the subject technology as claimed. It is also to be understood that other aspects may be utilized, and changes may be made without departing from the scope of the subject technology.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Figure 1A:
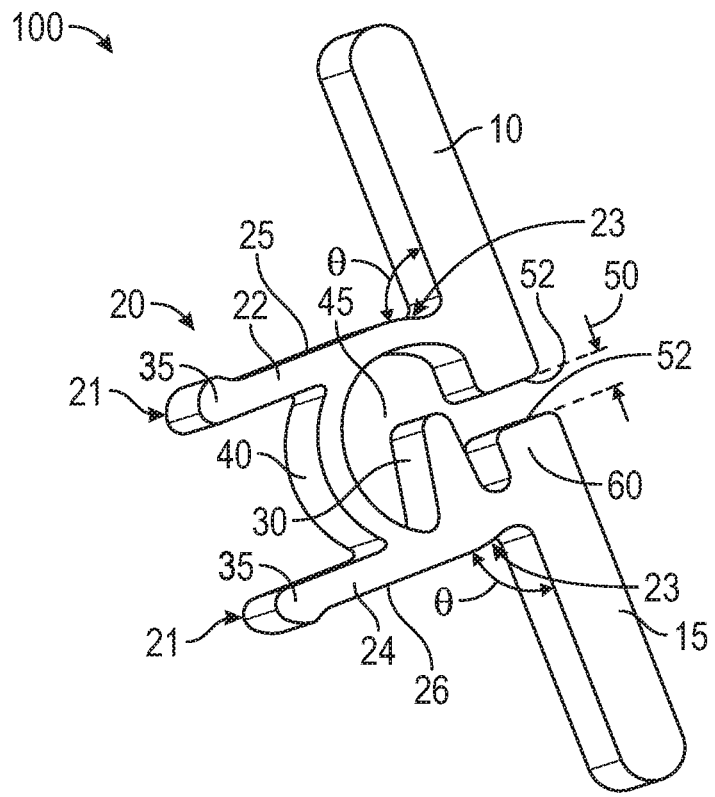
FIG. 1A is a perspective view of a standing clip, in accordance with some embodiments of the present disclosure.

The detailed description set forth below describes various configurations of the subject technology and is not intended to represent the only configurations in which the subject technology may be practiced. The detailed description includes specific details for the purpose of providing a thorough understanding of the subject technology. Accordingly, dimensions may be provided in regard to certain aspects as non-limiting examples. However, it will be apparent to those skilled in the art that the subject technology may be practiced without these specific details. In some instances, well-known structures and components are shown in block diagram form in order to avoid obscuring the concepts of the subject technology.

It is to be understood that the present disclosure includes examples of the subject technology and does not limit the scope of the appended claims. Various aspects of the subject technology will now be disclosed according to particular but non-limiting examples. Various embodiments described in the present disclosure may be carried out in different ways and variations, and in accordance with a desired application or implementation.

Currently available standoff (standing) fixtures for circuit boards are designed to be circuit board specific, and therefore are configured to specifically mount single assembly types of circuit boards. This is challenging when circuit card designs and form factors are widely variable, as no current single handling fixture or standoff can accommodate all circuits. Also, custom fixtures can be complicated and expensive. Configuring the standoff fixtures for a specific type and/or size of circuit board will necessitate manufacturing and/or acquiring a variety of standoff fixtures equally large in number to match the different types and/or sizes of circuit boards, thereby driving the cost up. Furthermore, custom standoff fixture use may require that the circuit board be modified or made with certain features for mounting the circuit board onto the custom standoff fixture.

Other currently available standoff fixtures include generic threaded standoff fixtures, which in addition to being incapable of accommodating a variety of sizes of circuit board, also require holes to be made in the circuit board. The generic threaded standoff clips described above often require that the circuit board has hardware holes in it for inserting the threaded standoff clips. Some circuit boards simply do not have holes, thereby necessitating modification thereof to include holes. The aforementioned ad-hoc fixturing can disadvantageously lead to damage of the circuit board. Additionally, the holes may become obscured or otherwise distorted during the assembly process (as hardware is installed), thereby rendering the threaded standoffs unsatisfactory for their intended use.

Furthermore, custom fixtures made for a specific assembly type of circuit board are costly (sometimes greater than $700 per fixture), often bulky, and usually have many moving parts that require great situational awareness to ensure that the circuit board is installed correctly onto the fixture. Failure to correctly install and mount the circuit board makes for a false sense of security and leads to drops and damage. Custom fixtures require design for each type of circuit board, and manufacture of multiples of each type of circuit board which his costly. Custom fixtures may need to be separately stored and tracked in the inventory system, which can also be costly. Additionally, adjustable circuit board fixtures generally have several moving parts, for example thumbscrews and clamps that must be secured properly to function correctly. These conventional circuit board fixtures often fail to accommodate boards other than those with rectangular shapes, or that have connectors or other features protruding beyond board edges.

Various embodiments of the present disclosure are directed to providing a clip with standing legs that can be clipped anywhere along edges of circuit boards having varying sizes. By arranging several such standing clips along the circuit board edges, the circuit board may be suspended safely off of the work surface (workbench, oven shelf, or any other desired surface) such that the circuit board is securely mounted during assembly, handling, storage, packaging, and other conditions that the circuit board may be subjected to in use.

The standing clips of the various embodiments of the present disclosure provide various advantages over the aforementioned standing fixtures. For example, since the standing clips of the various embodiments described herein can be attached almost anywhere along a board edge, the standing clips described herein could be used on a greater proportion of the circuit board then currently existing standoff fixtures. Additionally, since a gap for mounting an object between the legs of the standoff clips is variable, the standing clips described herein could be used on circuit boards of varying sizes and shapes than the currently existing standoff fixtures. As shall be described in further detail below, the standing clips may be designed to accommodate a range of circuit board thicknesses while still maintaining a positive grip on the edge of the circuit board. An orientation of the standing clips with respect to vertical may be adjustable so as to ensure that the standing clips are oriented perpendicular to the clamped circuit board while stably supporting the circuit board above the ground.

In some embodiments, the standing clips may be designed with various standing heights to meet different needs during production. Furthermore, since the standing clips of the various embodiments described herein do not need to be produced in a large number of varieties to accommodate varying circuit board sizes, shapes, and/or thicknesses, the standing clips can be produced cheaply and in large quantities. As such, the standing clips described herein could be made available to technicians on an as-needed basis, and disposed of if damaged or otherwise compromised.

Further advantageously, the standing clips may be made from an electrostatic dissipative (ESD) material so that the standing clips do not damage the circuit boards by electrostatic discharge. In some embodiments, as shall be described in further detail below, the material from which the standoff clips are formed may be chemical erosion resistant, may have a high thermal resistance, and may additionally have a high strength.

Figure 1B:
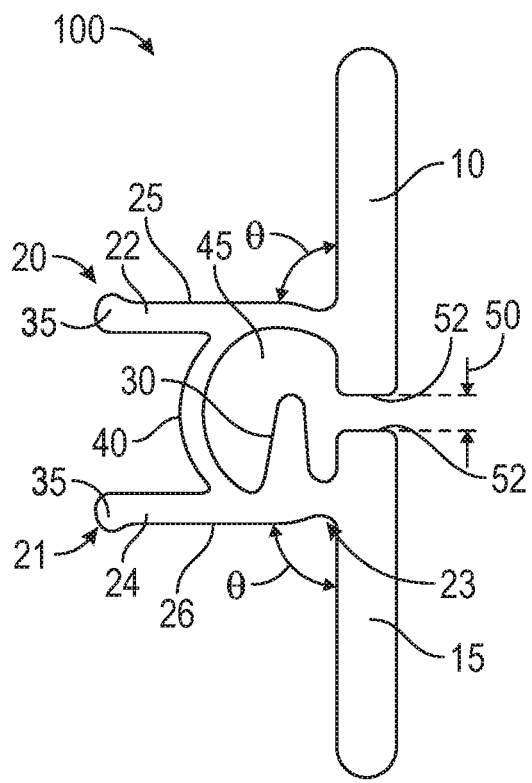
FIG. 1B is a side view of the standing clip of FIG. 1, in accordance with some embodiments of the present disclosure.

FIG. 1A is a perspective view of a standing clip 100, in accordance with some embodiments of the present disclosure. FIG. 1B is a side view of the standing clip 100 of FIG. 1, in accordance with some embodiments of the present disclosure. According to various embodiments of the present disclosure, the standing clip 100 may include a flexible grip 20 having upper and lower lever arms 22 and 24 extending from a body of the flexible grip 20. Each of the upper and lower lever arms 22 and 24 may extend from a first end 21 to a second end 23 of the flexible grip 20, As depicted in FIGS. 1A and 1B, the upper and lower lever arms 22 and 24 may be oriented opposite to, and spaced apart from each other in a first or rest state where no force is applied to the flexible grip 20. For example, in some embodiments, the upper and lower lever arms 22 and 24 may be formed parallel to each other, and in other embodiments, the upper and lower lever arms 22 and 24 may be formed within plus or minus 10 degrees of parallel to each other.

As depicted, the flexible grip 20 may include a first support leg 10 extending from a gripping surface 25 of the upper lever arm 22, and a second support leg 15 extending from a gripping surface 26 the lower lever arm 24. In some embodiments, the first and second support legs 10 and 15 may be axially or longitudinally spaced apart from each other. In particular, complementary clamping surfaces 52 of the first and second support legs 10 and 15 may be spaced apart from each other by a gap 50. The complementary clamping surfaces 52 are configured to clamp or otherwise grip an object, for example a circuit board or a portion thereof between the first and second support legs 10 and 15.

The first and second support legs 10 and 15 may each extend from the respective gripping surfaces 25 and 26 of the upper and lower lever arms 22 and 24 at a non-parallel angle. In particular, the first and second support legs 10 and 15 may each extend substantially perpendicularly from the respective gripping surfaces 25 and 26 of the upper and lower lever arms 22 and 24 of the flexible grip 20. For example, in some embodiments, each of the first and second support legs 10 and 15 may extend from the respective gripping surfaces 25 and 26 of the upper and lower lever arms 22 and 24 at a perpendicular angle (i.e., 90 degrees). In yet other embodiments, the first and second support legs 10 and 15 may each extend from the respective gripping surfaces 25 and 26 of the upper and lower lever arms 22 and 24 at an angle within plus or minus 10 degrees of the perpendicular angle. For example, the first and second support legs 10 and 15 may extend from the respective gripping surfaces 25 and 26 of the upper and lower lever arms 22 and 24 at an angle θ ranging from about 80 degrees to 100 degrees, more typically about 85 degrees to 95 degrees, specifically 87 degrees to 93 degrees, or in some cases approximately 90 degrees. Though recited in terms of certain ranges, it will be understood that all ranges from the lowest of the lower limits to the highest of the upper limits are included, including all intermediate ranges or specific angles, within this full range or any specifically recited range.

In accordance with various embodiments, as illustrated in FIGS. 1A and 1B, the upper lever arm 22 and the lower lever arm 24 may be coupled to each other. In particular, the flexible grip 20 may further include a deformable member 40 coupling the upper and lower lever arms 22 and 24 to each other. As depicted, the deformable member 40 may extend from and couple the upper and lower lever arms at positions between the first and second ends of the upper and lower lever arms.

The deformable member 40 may be coupled to the upper and lower lever arms 22 and 24. However, in other embodiments, as illustrated in FIGS. 1A and 1B, the deformable member 40 may be integrally formed with the upper and lower lever arms 22 and 24. For example, in some embodiments, the deformable member 40 may be a spring or similar structure that is elastically deformable when subjected to a force, e.g., a compressive or pinching force. In particular, when the flexible grip 20 is deformed or otherwise depressed by exerting a force on the upper and lower lever arms 22 and 24 to displace the upper and lower lever arms 22 and 24 towards each other ("pinching force"), the deformable member 40 may compress slightly, causing the upper and lower lever arms 22 and 24 to pivot in opposite directions away from each other at the second end 23. For example, once the upper and lower lever arms 22 and 24 are pinched towards each other, the deformable member 40 may compress or depress slightly so as to bow outwards towards the first end 21 of the flexible grip 20, thereby causing the upper lever arm 22 to pivot upwards at the second end of the flexible grip 20 and rotate the first support leg 10 counter-clockwise. Similarly, the lower lever arm 24 is caused to pivot downwards at the second end of the flexible grip 20 and rotate the second support leg 15 clockwise. As such, the flexibility of the flexible grip 20 may be derived at least in part from the bendability/deformability of the deformable member 40 as described above.

Accordingly, depressing or deforming the flexible grip 20 such that the upper and lower arms 22 and 24 pivot about the deformable member 40 causes the first and second support legs 10 and 15 to be rotated as described above, thereby moving the flexible grip 20 from a first state in which the complimentary clamping surfaces 52 are spaced apart from each other by a first amount to a second state in which the first and second lever arms are spaced apart from each other by a second, larger amount, to accommodate and clamp the object, e.g., the circuit board 300 (illustrated in FIGS. 3A and 3B) therebetweeen. In accordance with some embodiments, once the grip 20 is released, i.e., when the force is no longer applied to the grip 20 to pinch the upper and lower lever arms 22 and 24 towards each other, the spring force of the deformable member 40 biases the upper and lower arms back towards their original position in the first state. As such, a uniform clamping force is applied to the object, e.g., the circuit board 300 that is clamped between the first and second support legs 10 and 15.

In accordance with some embodiments, the flexible grip 20 may further include a stop 30 extending or otherwise protruding longitudinally from at least one of the upper and lower lever arms 22 and 24. As depicted, the stop 30 is positioned protruding from the lower lever arm 24, but the various embodiments of the present disclosure are not limited to the aforementioned configuration. The stop 30 may indeed be alternatively positioned to extend or protrude from the upper lever arm 22. In particular, a cavity 45 may be defined in the area bounded between the upper and lower lever arms 22 and 24, the deformable member 40, and the first and second support legs 10 and 15. As depicted, the stop 30 may extend from the lower lever arm 24 into the cavity 45 up to a height corresponding, slightly exceeding, or otherwise aligned with a position of the spacing or gap 50 between the clamping surfaces 52 of the first and second support legs 10 and 15. This configuration is advantageous in order to limit an extent to which an object, e.g., the circuit board 300 (illustrated in FIGS. 3A and 3B) clamped in the gap 52 between the first and second support legs 10 and 15 extends into the cavity 45. Accordingly, where the object to be clamped is a circuit board 300, the stop 30 prevents the clamping surfaces 52 of the first and second support legs 10 and 15, when positioned on the circuit board 300, from reaching and potentially interfering with or otherwise damaging delicate and sensitive electronic components of the circuit board 300.

Although the embodiments of FIGS. 1A and 1B illustrate the standing clip 100 having the stop 30 for limiting the extent to which to the circuit board 300 extends into the cavity 45, the present disclosure is not limited to this configuration. In some embodiments, for example the embodiments illustrated in FIGS. 2A-2C, the standing clip 200 may be configured without a stop 30. In these embodiments, the extent to which the circuit board 300 extends into the cavity 45 may be instead be limited by an inner surface (e.g., an inner radial or circumferential surface) of the deformable member 40. For example, the deformable member 40 may be designed such that a diameter thereof does not exceed a distance between an outer perimeter or edge of the circuit board 300 and the delicate electronic components. In this way, the standing clip 100 is prevented from interfering with or otherwise damaging the sensitive electronic components positioned adjacent to the perimeter or edges of the circuit board 300.

According to various embodiments, as illustrated in FIGS. 1A and 1B, the upper and lower lever arms 22 and 24 may each have a knob 35 disposed at the first end 21 of the flexible grip 20. The knob 35 may be advantageous in preventing the flexible grip 20 from slipping out of the hands or fingers of a user while attempting to grip and pinch the lower and upper lever arms 22 and 24 towards each other in preparation for clamping the object (e.g., circuit board 300) between the support legs 10 and 15. Accordingly, the knob 35 may serve to improve the user's grip on the upper and lower lever arms 22 and 24 during the clamping process.

Figure 2C:
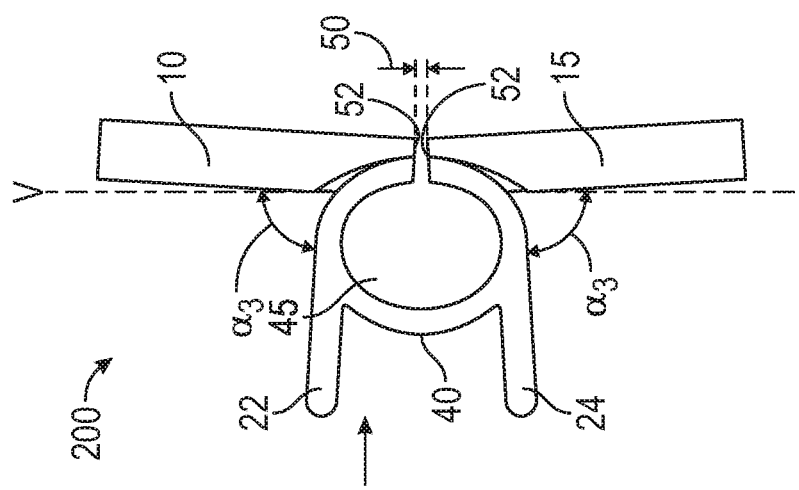
FIGS. 2A-2C are side views of a standing clip, in accordance with some embodiments of the present disclosure.
Figure 2B:
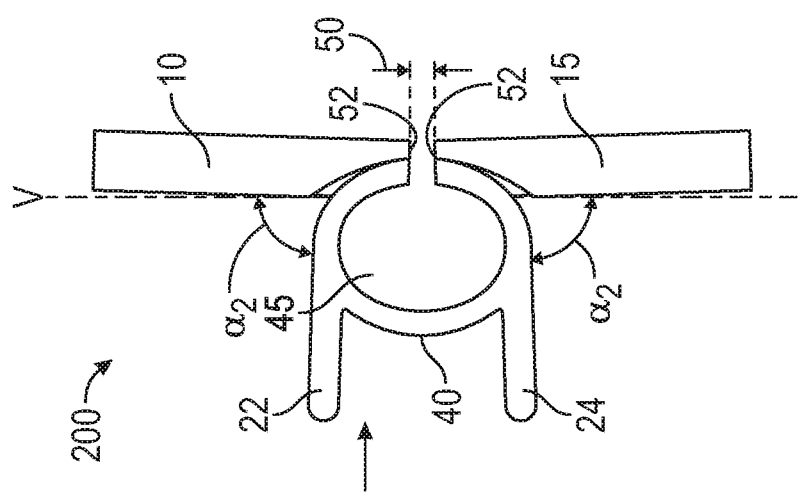
Figure 2A:
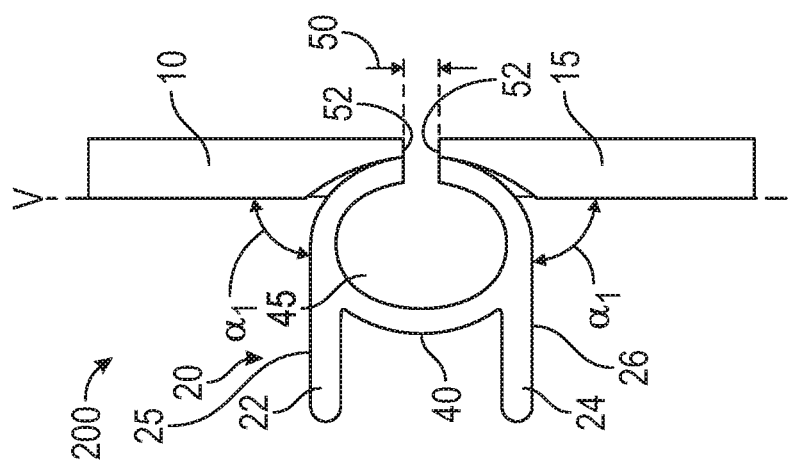

FIGS. 2A-2C are side views of a standing clip 200, in accordance with some embodiments of the present disclosure. Similar to the embodiments of FIGS. 1A and 1B, the standing clip 200 may include a flexible grip 20 and upper and lower lever arms 22 and 24 extending from the flexible grip 20. Similar to the standing clip 100, the upper and lower lever arms 22 and 24 may be oriented opposite to, and spaced apart from each other in a first or rest state where no force is applied to the flexible grip 20. For example, in some embodiments, the upper and lower lever arms 22 and 24 may be formed parallel to each other, and in other embodiments, the upper and lower lever arms 22 and 24 may be formed within plus or minus 10 degrees of parallel to each other.

Further similar to the embodiments of FIGS. 1A and 1B, the flexible grip 20 may include a first support leg 10 extending from the upper lever arm 22, and a second support leg 15 extending from the lower lever arm. In some embodiments, the first and second support legs 10 and 15 may be axially spaced apart from each other. In particular, complementary clamping surfaces 52 of the first and second support legs 10 and 15 may be spaced apart from each other by a gap 50. The complementary clamping surfaces 52 are configured to clamp or otherwise grip an object, for example a circuit board or a portion thereof between this first and second support legs 10 and 15.

As illustrated in FIGS. 2A-2C, ands referring back in part to FIGS. 1A and 1B, the first and second support legs 10 and 15 may each extend from the respective gripping surfaces 25 and 26 of the upper and lower lever arms 22 and 24 at a non-parallel angle θ (illustrated in FIGS. 1A and 1B), $α_1$ (illustrated in FIG. 2A), $α_2$ (illustrated in FIG. 2B), and $α_3$ (illustrated in FIG. 2C). In particular, the first and second support legs 10 and 15 may each extend substantially perpendicularly from the respective gripping surfaces 25 and 26 of the upper and lower lever arms 22 and 24 of the flexible grip 20. For example, in some embodiments, each of the first and second support legs 10 and 15 may extend from the respective gripping surfaces 25 and 26 of the upper and lower lever arms 22 and 24 at an angle of 90 degrees. In yet other embodiments, the first and second support legs 10 and 15 may each extend from the respective gripping surfaces 25 and 26 of the upper and lower lever arms 22 and 24 at an angle within plus or minus 10 degrees of perpendicular. In accordance with some embodiments, the first and second support legs 10 and 15 may extend from the respective gripping surfaces 25 and 26 of the upper and lower lever arms 22 and 24 at angles θ, $α_1$, $α_2$, and $α_3$ ranging from about 80 degrees to 100 degrees, more typically about 85 degrees to 95 degrees, specifically 87 degrees to 93 degrees, or in some cases approximately 90 degrees. Though recited in terms of certain ranges, it will be understood that all ranges from the lowest of the lower limits to the highest of the upper limits are included, including all intermediate ranges or specific angles, within this full range or any specifically recited range.

Elements of the standing clip 200 having similar structure to that of the standing clip 100 are numbered similarly herein, thus a further detailed description thereof shall be omitted with respect to FIGS. 2A-2C. The embodiments of FIGS. 2A-2C illustrate the extent to which the first and second support legs 10 and 15 may be oriented to each be angularly offset from vertical V, in the first state, before the pinching force has been applied to the grip 20. In some embodiments in the first state, before the pinching force has been applied to the grip 20, the first and second support legs 10 and 15 may be oriented to each be angularly offset from vertical V. For example, each of the first and second support legs may be angularly offset from vertical V by an angle ranging from about −10 degrees to 10 degrees, more typically about −5 degrees to 5 degrees, specifically −3 degrees to 3 degrees, or in some cases approximately 0 degrees (i.e., no offset). Though recited in terms of certain ranges, it will be understood that all ranges from the lowest of the lower limits to the highest of the upper limits are included, including all intermediate ranges or specific angles, within this full range or any specifically recited range.

Accordingly, orienting the first and second support legs angularly offset from vertical V as described above allows that when the pinching force is applied to the grip 20 to pivot the upper and lower lever arms 22 and 24 about the deformable member 40, the first and second support legs 10 and 15 may be pivoted in the respective counter-clockwise and clockwise directions from their positions in the first state to their positions in the second state where the first and second support legs 10 and 15 are aligned with the vertical V. Aligning the first and second support legs with the vertical V orients the first and second support legs 10 and 15 vertically when placed to stand on a desired surface, thereby advantageously supporting and suspending a portion of the object, e.g., the circuit board above a desired surface in an upright versus a tilted manner having less stability. As such, it can be appreciated that orienting the first and second support legs in a manner angularly offset from vertical V as described above compensates for the degree to which the first and second support legs 10 and 15 will be rotationally translated towards the vertical as a result of placing an object (e.g., a circuit board) having a thickness larger than the size of the gap 50 between the clamping surfaces 52. Due to this compensation, the first and second support legs 10 and 15 will be oriented vertically in the second state where the circuit board is clamped between the clamping surfaces 52.

Advantageously, since the degree or amount of the spacing or gap 50 between the complimentary clamping surfaces 52 can be modified, the standing clip 100 of the various embodiments described herein has a simplified configuration able to accommodate circuit boards of varying sizes contrary to the conventional circuit board fixtures described above which are circuit board specific and incapable of holding circuit boards of varying sizes.

Figure 3A:
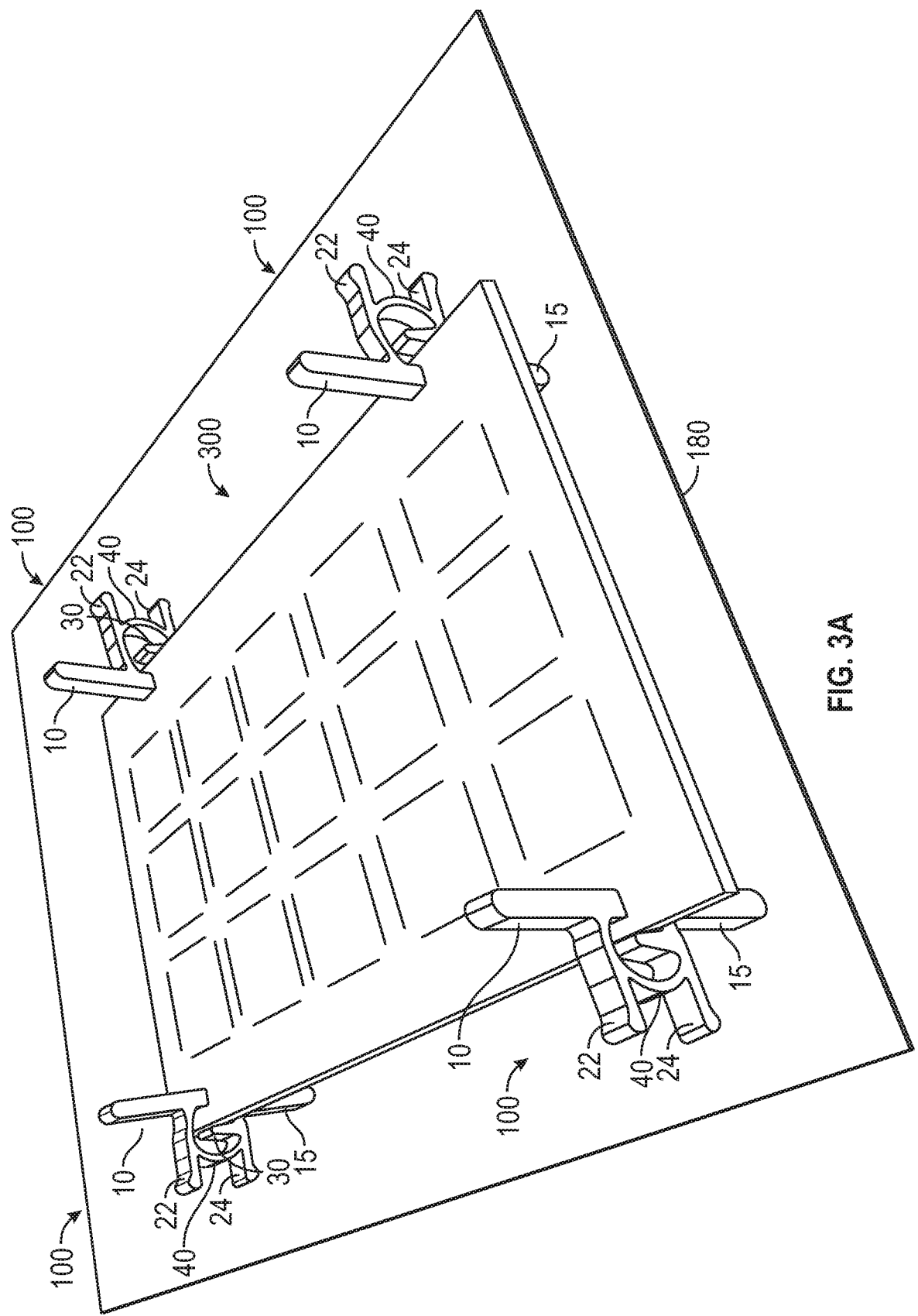
FIG. 3A is a perspective view of the standing clips of FIGS. 1A and 1B mounting a circuit board above a work surface, in accordance with some embodiments of the present disclosure.
Figures 3B, 3C:
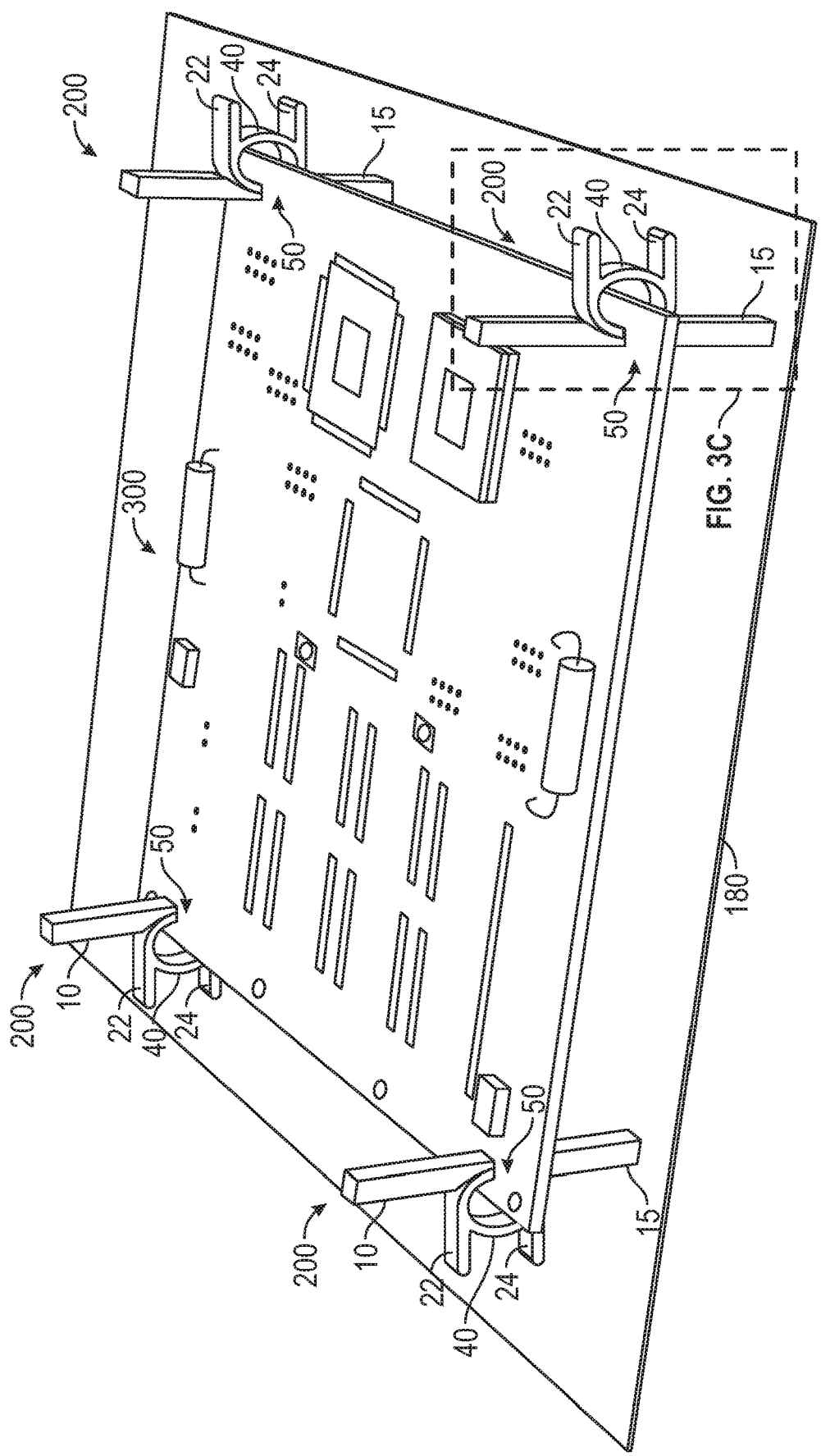
FIG. 3B is a perspective view of the standing clips of FIGS. 2A-2C mounting a circuit board above a work surface, in accordance with some embodiments of the present disclosure.

The angle at which the first and second support legs 10 and 15 are offset from vertical V is important in dictating how far apart the clamping surfaces 52 can be spaced (and correspondingly, the maximum thickness of an object, e.g., a circuit board 300 that can be clamped therebetween), while maintaining the first and second support legs 10 and 15 aligned with the vertical V. It is important that the first and second support legs 10 and 15 of each of the standing clips 100 and 200 be substantially aligned with the vertical V while the circuit board 300 is clamped therebetween so that the standing clips may stand flat, and thus be stably mounted on the surface above which they are suspending the circuit board, as illustrated in FIGS. 3A and 3B described below. As described herein, an angle which is substantially vertical is defined as one which is angularly offset from vertical V by an amount ranging from about −10 degrees to 10 degrees, more typically about −5 degrees to 5 degrees, specifically −3 degrees to 3 degrees, or in some cases approximately 0 degrees (i.e., no offset).

Accordingly, the size of the gap 50 between the clamping surfaces 52 of FIGS. 2A-2C in the first state may be dependent on the angle $\alpha_1$, $\alpha_2$, and $\alpha_3$ at which the first and second support legs 10 and 15 extend from the respective gripping surfaces 25 and 26 of the upper and lower lever arms 22 and 24. For example, in the illustrated embodiments, $\alpha_1<\alpha_2<\alpha_3$, thereby producing a corresponding variation in size of the gap 50 in the various embodiments of FIGS. 2A-2C, where gap 50 at $\alpha_3$<gap 50 at $\alpha_2$<gap 50 at $\alpha_1$.

The embodiments of FIGS. 2A-2C differ from those of the embodiments of FIGS. 1A and 1B in that the flexible grip 20 may be formed without the stop 30. As described above, in these embodiments, the extent to which the circuit board 300 extends into the cavity 45 may be instead be limited by an inner surface of the deformable member 40. For example, the deformable member 40 may be designed such that a diameter thereof does not exceed a distance between an outer perimeter of the circuit board 300 and the sensitive electronic components of the circuit board 300. In this way, the standing clip 200 is prevented from interfering with the sensitive electronic components positioned closest to the perimeter or edges of the circuit board 300.

FIG. 3A is a perspective view of the standing clips 100 of FIGS. 1A and 1B mounting a circuit board 300 above a work surface, in accordance with some embodiments of the present disclosure. FIG. 3B is a perspective view of the standing clips 200 of FIGS. 2A-2C mounting a circuit board 300 above a work surface, in accordance with some embodiments of the present disclosure. As depicted in FIGS. 3A and 3B, the standing clips 100 and 200 may be used to suspend the circuit board 300 above a particular surface, e.g., a work surface 180. A plurality of the standing clips 100, 200 may thus be conveniently positioned along several open edges, or along a perimeter of the designated circuit boards 300.

In particular, as described above, a force (e.g., the pinching force) is applied to the grip 20 to rotate the first and second support legs 10 and 15 away from each other in order to open the gap 50 and accommodate an object between the clamping surfaces 52. Although the object is illustrated in FIGS. 3A and 3B as a circuit board, the various embodiments of the present disclosure are not limited thereto, and other objects may be clamped between surfaces 52 as desired. As illustrated in FIGS. 3A and 3B, several standing clips 100, 200 may be placed around a perimeter or edges of the circuit board 300 For example, the standing clips 100, 200 may be clipped at or adjacent to each of the corners of the circuit board 300. Once the pinching force is removed from the grip 20, the elastic force of the deformable member to return towards its undeformed state biases the first and second support legs 10 and 15 to rotate back towards each other until they each contact and press against the circuit board 300 placed between them. As previously described, in the first state, each of the first and second support legs 10 and 15 may be angularly offset from the vertical by an angle ranging from about −10 degrees to 10 degrees, more typically about −5 degrees to 5 degrees, specifically −3 degrees to 3 degrees, or in some cases approximately 0 degrees. In the second state, the first and second legs 10 and 15 are no longer oriented in their angular positions in the first state, but instead each rotated and displaced slightly outward and away from each other to produce the increase in size of the gap 52 in which the circuit board 300 is now clamped. Due to the circuit board 300 being clamped between the clamping surfaces 52 of the first and second support legs 10 and 15, the angle at which the first and second support legs 10 and 15 are oriented is no longer offset with respect to the vertical V, but instead now aligned or parallel with the vertical V. Accordingly, in the second state each of the standing clips 100 and 200 are oriented vertically, or at least substantially vertically (i.e., within plus or minus 3 degrees of vertical), as illustrated in FIGS. 3A and 3B.

Figure 4:
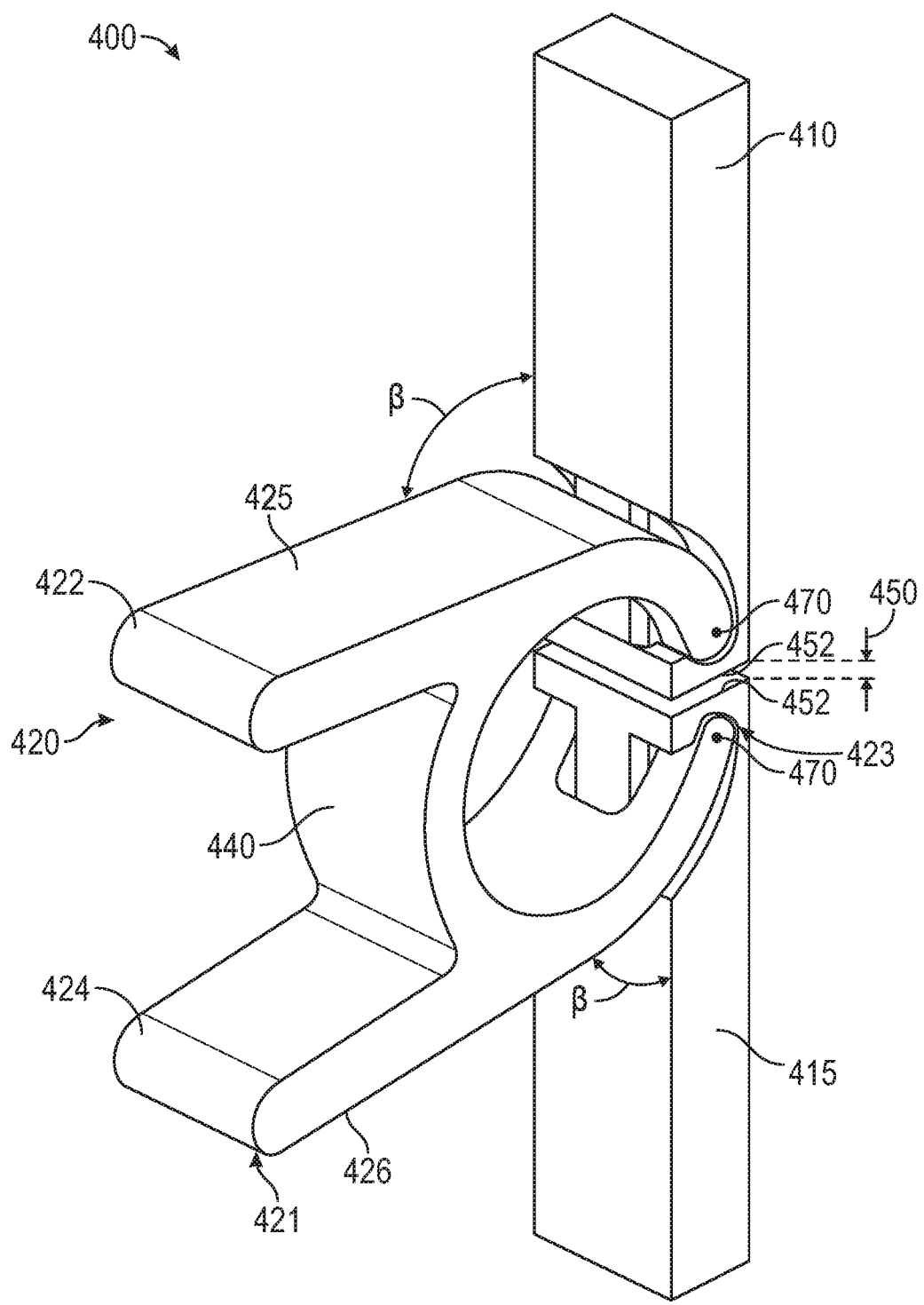
FIG. 4 is a perspective view of a standing clip, in accordance with some embodiments of the present disclosure.

FIG. 4 is a perspective view of a standing clip, in accordance with some embodiments of the present disclosure. Similar to the standing clips 100 and 200, the standing clip 400 may include a flexible grip 420 having upper and lower lever arms 422 and 424 extending from the flexible grip 420. Each of the upper and lower lever arms 422 and 424 may extend from a first end 421 to a second end 423 of the flexible grip 420, As depicted in FIG. 4, the upper and lower lever arms 410 and 415 may be oriented opposite to, and spaced apart from each other.

As depicted, the flexible grip 420 may include first and second support legs 410 and 415 rotatably coupled to the respective upper and lower lever arm 422 and 424. For example, each of the first and second support legs 410 may be hingedly coupled to the respective upper and lower lever arm 422 and 424. Accordingly, hinge pins 470 may each be used to rotatably couple each of the first and second support legs 410 and 415 to the respective upper and lower support arms 422 and 424. Similar to the first and second support legs 10 and 15, the first and second support legs 410 and 415 may have complementary clamping surfaces 452 which are spaced apart from each other by a gap 450. The complementary clamping surfaces 452 are configured to clamp or otherwise grip an object, for example a circuit board 300 or a portion thereof between the first and second support legs 410 and 415.

In some embodiments, the first and second support legs 410 and 415 may each be hingedly coupled to the respective upper and lower lever arms 422 and 424 and extend therefrom at a non-parallel angle with respect to gripping surfaces 425 and 426 of the upper and lower lever arms 422 and 424. In particular, in the first state where before the flexible grip 420 has been subjected to the pinching force, the first and second support legs 410 and 415 may each be hingedly coupled to the respective upper and lower lever arms 422 and 424 so as to extend substantially perpendicularly with respect to the gripping surfaces 425 and 426 of the upper and lower lever arms 422 and 424. For example, in the first state, each of the first and second support legs 410 and 415 may be hingedly coupled to the respective upper and lower lever arms 422 and 424 extend at an angle (3 of approximately 90 degrees with respect to the gripping surfaces 425 and 426. In yet other embodiments, the first and second support legs 410 and 415 may each extend at an angle β within plus or minus 10 degrees of perpendicular (90 degrees) with respect to the gripping surfaces 425 and 426. In some embodiments, the first and second support legs 410 and 415 may be hingedly coupled to the respective upper and lower lever arms 422 and 424 and extend therefrom at an angle β ranging from about 80 degrees to 100 degrees, more typically about 85 degrees to 95 degrees, specifically 87 degrees to 93 degrees, or in some cases approximately 90 degrees with respect to gripping surfaces 425 and 426. Though recited in terms of certain ranges, it will be understood that all ranges from the lowest of the lower limits to the highest of the upper limits are included, including all intermediate ranges or specific angles, within this full range or any specifically recited range.

In accordance with various embodiments, similar to the embodiments illustrated in FIGS. 1A and 1B, the upper lever arm 422 and the lower lever arm 424 may be coupled to each other. In particular, the flexible grip 420 may further include a deformable member 440 coupling the upper and lower lever arms 422 and 424 to each other. As depicted, the deformable member 440 may extend from and couple the upper and lower lever arms 422 and 424 at positions between the first and second ends 421 and 423 of the flexible grip 420.

In some embodiments, the deformable member 440 may be coupled to the upper and lower lever arms 422 and 424. However, in other embodiments, the deformable member 440 may be integrally formed with the upper and lower lever arms 422 and 424. Similar to the deformable member 40, the deformable member 440 may be a spring or similar structure that is elastically deformable when subjected to a force, e.g., a compressive or pinching force. In particular, when the flexible grip 420 is deformed or otherwise depressed by exerting the pinching force on the upper and lower lever arms 422 and 424 to displace the upper and lower lever arms 422 and 424 towards each other, the deformable member 440 may compress slightly, causing the upper and lower lever arms 422 and 424 to pivot in opposing directions at the second end 423. For example, once the upper and lower lever arms 422 and 424 are pinched towards each other, the deformable member 440 may compress or depress slightly so as to bow outwards towards the first end 421 of the flexible grip 420, thereby causing the upper lever arm 422 to pivot upwards at the second end 423 of the flexible grip 20 and rotate the first support leg 410 counter-clockwise. Similarly, the lower lever arm 424 is caused to pivot downwards at the second end of the flexible grip 420 and rotate the second support leg 415 clockwise.

Accordingly, depressing or deforming the flexible grip 420 such that the upper and lower arms 422 and 424 pivot about the deformable member 440 causes the first and second support legs 410 and 415 to be rotated as described above, thereby allowing the flexible grip 420 to move from the first state in which the complimentary clamping surfaces 452 are spaced apart from each other by a first amount to a second state in which the first and second lever arms 422 and 424 are spaced apart from each other by a second, larger amount, to accommodate and clamp the object, e.g., the circuit boards 300 (illustrated in FIGS. 3A and 3B) therebetween. Once the grip 420 is released, i.e., when the pinching force is removed from the grip 420, the spring force of the deformable member 440 biases the upper and lower arms back towards their original position in the first state. As such, a uniform clamping force is applied to the object, e.g., the circuit board 300 that is clamped between the first and second support legs 410 and 415.

Accordingly, the first and second support legs 410 and 415 are not only pivotable to rotate in the respective counter-clockwise and clockwise directions as a result of applying the pinching force to the flexible grip 420, but are also rotatable about a longitudinal axis of the respective hinge pin 470. The aforementioned configuration advantageously allows for the first and second support legs 410 and 415 to be rotated to a position in which they are axially aligned with the vertical regardless of a variation in size (for example thickness) of objects to be inserted or otherwise clamped between the clamping surfaces 452 of the first and second support legs 410 and 415.

Since the angle of orientation of the first and second support legs 410 and 415 with respect to vertical is adjustable after insertion of the object therebetween, the first and second support legs may be rotated to be perpendicular to the surface of the object clamped between the clamping surfaces 452 while being oriented vertically. As such, the standing clip 400 is capable of stably supporting and suspending the object, e.g., a circuit board above a desired surface for assembly, transportation, further processing or any other desired purpose.

Although the flexible grip 420 of standing clip 400 is illustrated as not having one, in some embodiments, the flexible grip 420 may have a stop similar to the stop 30 discussed above. In these embodiments, the stop may extend or otherwise protrude longitudinally from at least one of the upper and lower lever arms 422 and 424. In particular, similar to the standing clips 100 and 200, a cavity 445 may be defined in the area bounded between the upper and lower lever arms 422 and 424, the deformable member 440, and the first and second support legs 410 and 415. As previously described with respect to stop 30, the stop may extend from either the lower or the upper lever arm 422 or 424 into the cavity 445 up to a height corresponding, slightly exceeding, or otherwise aligned with a position of the gap 450 between the clamping surfaces 452. This configuration may be advantageous in order to limit an extent to which an object (e.g., the circuit board 300 illustrated in FIGS. 3A and 3B) clamped in the gap 452 between the first and second support legs 410 and 415 extends into the cavity 445. Accordingly, where the object is a circuit board 300, the stop would prevent edges or an outer perimeter of the circuit board 300 from reaching and potentially interfering with delicate and sensitive electronic components of the circuit board 300.

In accordance with various embodiments of the present disclosure, the circuit standing clips 100, 200 and 400 may be made from a material which has a high enough strength to resist snapping or otherwise breaking when subjected to the pinching force, for example a metal or plastic material. The standing clips 100, 200, and 400 may also be made from a material having a high temperature resistance (for example a resistance to temperatures up to 400 degrees Fahrenheit), and which is resistant to chemical attack. For example, the standing clips 100, 200 and 400 may be formed of an electrostatic dissipative (ESD) plastic material which minimizes or otherwise prevents the standing clips 100, 200 and 400 from damaging the sensitive electronic components of the circuit board 300 by electrostatic discharge. In particular, in some embodiments the standing clips may be formed from an ESD polyetherketoneketone (PEKK) plastic material. ESD PEKK is advantageous as it possesses the aforementioned qualities of high strength, high temperature, and resistance to chemical attack.

It is advantageous for the material from which the standing clips 100, 200 and 400 are formed to be resistant to chemical attack as during processing and final assembly, the circuit boards 300—while clamped and mounted onto the standing clips 100, 200 and 400—may be subjected to various processing conditions, such as chemical washes, coatings, or similar processes. Configuring the standing clips 100, 200 and 400 such that they are resistant to chemical attack allows for the material of the clips 100, 200 and 400 to be preserved instead of being eaten away by the chemicals used. It is further advantageous for the material from which the standing clips 100, 200 and 400 are formed to possess high temperature resistance as the various processing conditions commonly include placing the circuit board 300 in a vacuum chamber and oven-baking at a temperature up to 400 degrees Fahrenheit. If the standing clips 100 are formed of a material having a lower thermal resistance, then the standing clips 100, 200 and 400 may be susceptible to failure or melting, which may render them unusable for the intended purpose.

Figure 5:
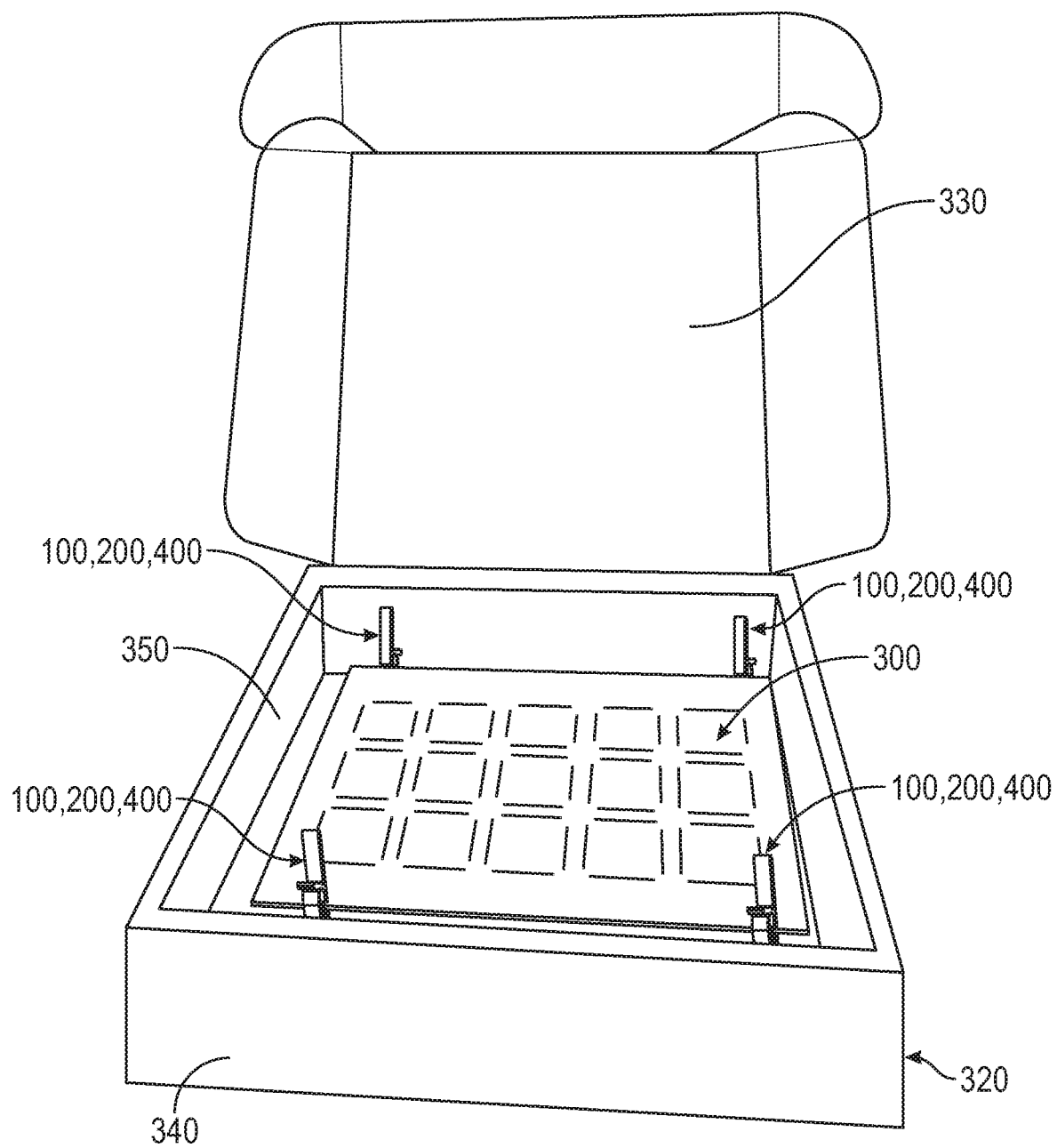
FIG. 5 illustrates standing clips used to securely package a circuit board, in accordance with some embodiments of the present disclosure.

FIG. 5 illustrates standing clips used to securely package a circuit board, in accordance with some embodiments of the present disclosure. The standing clips 100, 200 and 400 may be used during hand assembly, oven cycles, storage, packaging, or other processes in which it is desired that the circuit boards 300 be delicately supported above a desired surface, e.g. a work surface during assembly or baking during an oven baking processes. FIG. 5 illustrates the standing clips 100, 200 and 400 used to package the circuit board 300. As depicted, the standing clips 100, 200 and 400 may serve not only to support the circuit board 300 above a desired surface, also to securely mount the circuit board 300 in a packaging box 320 for example, for shipping to a desired location. As illustrated, the first support legs 10 and 410, and the second support legs 15 and 415 of the respective standing clips 100, 200 and 400 act as a spacer between the respective lid 330 and bottom surface 350 of the packaging box 320. Advantageously, the sensitive and delicate electronic components of the circuit board 300 may be safely packaged in the box without risk of coming into contact, and potentially being scratched or otherwise damaged by the lid and bottom surfaces 330 and 350 of the boxes 320 in which they are packaged.

As depicted, when clamped onto the perimeter or edges of the circuit board as desired, the standing clips 100, 200 and 400 are able to support and suspend the circuit board 300 above the work surface 180. Due to the vertical orientation of the first support legs 10 and 410, and the second support legs 15 and 415 of the respective standing clips 100, 200 and 400, the circuit board 300 may be supported in an upright and stable position with limited to no risk of tilting or tipping over and potentially damaging the circuit board 300. Accordingly, the standing clips 100, 200 and 400 may be designed and manufactured such that they may be clamped to any edge of various circuit boards ranging in thickness, size. and design. Advantageously, by arranging several such standing clips 100, 200 and 400 along edges or the perimeter of the circuit board 300, the circuit board 300 may be suspended safely above the work surface 180 (e.g., workbench, oven shelf, etc. . . . ) such that the circuit board 300 is safe during assembly, handling, and storage. Because the standing clips of the various embodiments described herein can be attached almost anywhere along the circuit board edges or perimeter, the standing clips 100, 200 and 400 may be used on a greater proportion of varying circuit board sizes and shapes than the conventional circuit board fixtures which are more rigid in structure and are custom made to fit only a specific size circuit board. As such, the standing clips 100 and 200 of the various embodiments described herein could be designed to accommodate a range of circuit board thicknesses while still maintaining a positive grip on the edge or perimeter of each circuit board 300 in a vertical orientation.

Advantageously, since the gap 50, 450 between the complimentary clamping surfaces 52, 452 may be varied, the standing clips 100, 200 and 400 of the various embodiments described herein have a simplified configuration able to accommodate circuit boards of varying sizes. This is in contrast to the conventional circuit board fixtures described above which are circuit board specific and incapable of holding circuit boards of varying sizes.

In some embodiments, the standing clips 100, 200, and 400 (discussed below) may be designed with various standing heights to meet different needs during production. For example, a first type of the standing clips 100, 200 and 400 may be made with first and second support legs 10 and 410, and 15 and 415 having different lengths than first and second support legs 10 and 410, and 15 and 415 of a second type of the standing clips 100, 200, and 400. The standing clips 100, 200, and 400 may also be produced cheaply and in large quantities, so they could be made available to technicians on an as-needed basis, and disposed of if damaged or otherwise compromised.

As depicted, the first support legs 10 and 410 may be symmetrically arranged with respect the second support legs 15 and 415 about the flexible grip 420. For example, an angular position of the first support legs 410 may be symmetric and mirror that of the second support legs 415 about an imaginary axis running parallel to and defined between the clamping surfaces 52 and 452. The aforementioned configuration is advantageous in that when the circuit board 300 needs to be turned over in order to process or otherwise access the underside thereof, the entire circuit board/standing clip assembly may simply be flipped over and still maintain the same ability to stably support the circuit board 300 due to the symmetric nature of the support legs of each of the clips.

In some embodiments of the present disclosure, instead of having two support legs, the standing clips 100, 200, and 400 may each be formed with only one bottom support leg, e.g., support leg 15, 415 for supporting the circuit board 300 above the desired surface. Designing the standing clips 100, 200, and 400 without the first (i.e., the upper/upward facing) support leg 10, 410 may be advantageous so as to allow the standing clips 100, 200, and 400 to support the circuit board 300 over the desired surface without otherwise interrupting or interfering with assembly operations or machine movements taking place directly above the circuit board 300.

The previous description is provided to enable any person skilled in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the embodiments disclosed herein.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A standing clip for supporting an object in an upright position, the standing clip comprising:
    a flexible grip having an upper lever arm, a lower lever arm, and an elastically deformable spring member coupling the upper lever arm to the lower lever arm, each of the upper and lower lever arms extending from a first end to a second end of the flexible grip, wherein each of the upper and lower lever arms comprise a gripping surface;
    a first support leg extending from the upper lever arm at the second end of the flexible grip;
    a second support leg extending from the lower lever arm at the second end of the flexible grip, wherein the first and second support legs each extend at a substantially perpendicular angle from the respective upper and lower lever arms;
    a single, continuous cavity defined in an area bounded between the upper and lower lever arms, the elastically deformable spring member, and the first and second support legs; and
    a stop extending longitudinally into the single, continuous cavity from at least one of the upper and lower lever arms, the stop positioned between the upper and lower lever arms to limit an extent to which the object extends into the single, continuous cavity when clamped between the first and second support legs, wherein:
        the first and second support legs comprise complimentary clamping surfaces configured for clamping the object therebetween, the second support leg being positioned opposite to and spaced apart from the first support leg by a gap;
        the flexible grip is depressible from a first state in which the gap is a first size to a second state in which the gap is a second size;
        the elastically deformable spring member biases the upper and lower lever arms towards the first state; and
        the first and second support legs are oriented substantially vertically in the second state to clamp and suspend the object above a desired surface.

2. The standing clip of claim 1, wherein the second size is greater than or equal to the first size.

3. The standing clip of claim 1, wherein the substantially perpendicular angle comprises an angle which ranges between 5 degrees less than and 5 degrees greater than perpendicular.

4. The standing clip of claim 1, wherein the elastically deformable spring member extends from and couples the upper and lower lever arms at positions between the respective first and second ends of the upper and lower lever arms.

5. The standing clip of claim 1, wherein the deformable member comprises an elastically deformable spring member, and when the upper and lower lever arms are depressed in a direction towards each other, the elastically deformable spring member is compressible to pivot the first and second support legs away from each other to manipulate a size of the gap between the first and second support legs.

6. The standing clip of claim 1, wherein the elastically deformable spring member is integrally formed with the upper and lower lever arms.

7. The standing clip of claim 1, wherein the first and second support legs are formed of a material having at least one property selected from the group consisting of a high thermal resistance, high strength, and resistance to chemical attack.

8. The standing clip of claim 7, wherein the material comprises an electrostatic dissipative (ESD) material.

9. The standing clip of claim 8, wherein the ESD material comprises ESD polyetherketoneketone (PEKK).

* * * * *